United States Patent [19]

Mattfeld

[11] 4,302,719
[45] Nov. 24, 1981

[54] CIRCUIT FOR CONTROLLING A CURRENT SOURCE TRANSISTOR

[75] Inventor: Johann Mattfeld, Unterheinriet, Fed. Rep. of Germany

[73] Assignee: Licentia patent-Verwaltungs-G.m.b.H., Frankfurt am Main, Fed. Rep. of Germany

[21] Appl. No.: 132,528

[22] Filed: Mar. 21, 1980

[30] Foreign Application Priority Data

Mar. 22, 1979 [DE] Fed. Rep. of Germany ....... 2911171

[51] Int. Cl.³ .............................................. G05F 3/20
[52] U.S. Cl. .................................... 323/316; 330/273
[58] Field of Search ................. 323/1, 4, 19, 312, 315, 323/316; 307/296 R, 297; 330/273, 296, 297

[56] References Cited

U.S. PATENT DOCUMENTS

| | | | |
|---|---|---|---|
| 3,588,672 | 6/1971 | Wilson | 323/4 |
| 3,743,850 | 7/1973 | Davis | 323/4 X |
| 3,914,683 | 10/1975 | Plassche | 323/1 |
| 4,009,432 | 2/1977 | Dingwall et al. | 323/4 |
| 4,172,992 | 10/1979 | Culmer et al. | 323/4 |
| 4,177,417 | 12/1979 | Henry et al. | 323/4 |

FOREIGN PATENT DOCUMENTS 487460  4/1970  Switzerland .

OTHER PUBLICATIONS

Anzani, "Current Generator Made with Four Parts", Electronic Design, vol. 3, Feb. 1, 1968, p. 134.

Frisch, Elektronik, 1975, Lexika-Verlag Grafenau 1/Württ, pp. 277, 278.

*Primary Examiner*—A. D. Pellinen
*Attorney, Agent, or Firm*—Spencer & Kaye

[57] ABSTRACT

A circuit for controlling a current source transistor in dependence on a d.c. supply voltage comprises a further current source connected to the d.c. supply voltage source, and supplying a component with current, the control voltage for the current source transistor dropping across the component and a resistor controllable in dependence in the d.c. supply voltage and connected in parallel with the component.

8 Claims, 2 Drawing Figures

CIRCUIT FOR CONTROLLING A CURRENT SOURCE TRANSISTOR

BACKGROUND OF THE INVENTION

This invention relates to a circuit for controlling a current source transistor.

A large number of circuits are known for the production of temperature-compensated transistor currents. The temperature is compensated for example, by applying bias voltages at the base-emitter paths of the transistors, through which constant currents have flowed, at diode paths operated in the direction of flow, these diode paths having the same temperature characteristics as the transistors.

However it is not absolutely certain from this temperature compensation that the currents flowing through the transistors are independent of the magnitude of the d.c. supply voltage. This is because the current sources do not have an infinitely large resistance and moreover, as the collector-emitter voltages across the transistors increase, which may be caused for example by the increase in the d.c. supply voltage, the collector current through these transistors rises because of the current voltage characteristics which are specific to the component. In a push-pull output stage, this means, for example, that the collector quiescent current also rises through the output stage transistors as operating voltage rises even if this collector quiescent current is produced with the aid of a temperature-stabilising circuit. This undesirble increase in the quiescent collector current through output stage transistors of the push-pull output stage may lead to self-destruction of the output stage transistors as the operating voltage rises.

SUMMARY OF THE INVENTION

It is an object of the present invention to provide a circuit by means of which the currents through current source transistors may be controlled as a function of the d.c. supply voltage. Thus the transistor current either remains constant or even becomes smaller as the d.c. supply voltage begins to rise.

According to the invention, there is provided a circuit for controlling a current source transistor in dependence on a d.c. supply voltage comprising a first current source, a component supplied with current from said further current source and across which a control voltage for said current source transistor drops and a resistor controllable in dependence on said d.c. supply voltage and connected in parallel with said component.

Further according to the invention, there is provided a circuit for controlling a current source transistor as a function of the d.c. supply voltage, wherein a further current source is connected to said d.c. supply voltage source, said further current source supplying a component with current, the control voltage for the current source transistor dropping across this component; and a resistor which is controllable in dependence on the supply voltage is connected in parallel with said component.

BRIEF DESCRIPTION OF THE DRAWINGS

The invention will now be described in greater detail by way of example, with reference to the drawings, in which.

DESCRIPTION OF THE PREFERRED EMBODIMENT

In a preferred embodiment of the invention a circuit for controlling a current source transistor as a function of the d.c. supply voltage has a further current source connected to the d.c. supply voltage source which supplied a component with current, across which component the control voltage for the current source transistor drops; and a resistor which may be controlled as a function of the supply voltage is connected in parallel with this component.

The control voltage for the controllable resistor, which is preferably a transistor, is tapped off at a voltage divider connected between the poles of the supply voltage source. In order to save current, this volage divider may, at the same time, form the series resistance of the further current source.

As the component across which the control voltage for the current transistor or current source transistors drops, a semi-conductor diode which is connected in parallel to the base-emitter path of the current source transistor and which has the same temperature characteristics as the current source transistors may be used in order to bring about temperature compensation of the transistor current at the same time in this way. The series resistance of the further current source comprises the voltage divider which has already been mentioned while the base of a transistor is connected to the tap of this voltage divider. This transistor is connected in parallel with the diode which controls the current source transistor and thus takes over the function of a controllable resistor.

The above circuit is preferably so dimensioned that the current through the current source transistor or, if necessary also through several current source transistors, remains constant when the d.c. supply voltage changes or even decreases slightly for the purpose of overcompensating. With this circuit, the currents, in particular, may be controlled and serve to produce an initial voltage for the base-emitter paths of the output stage transistors in a push-pull output stage circuit.

Figure 1:
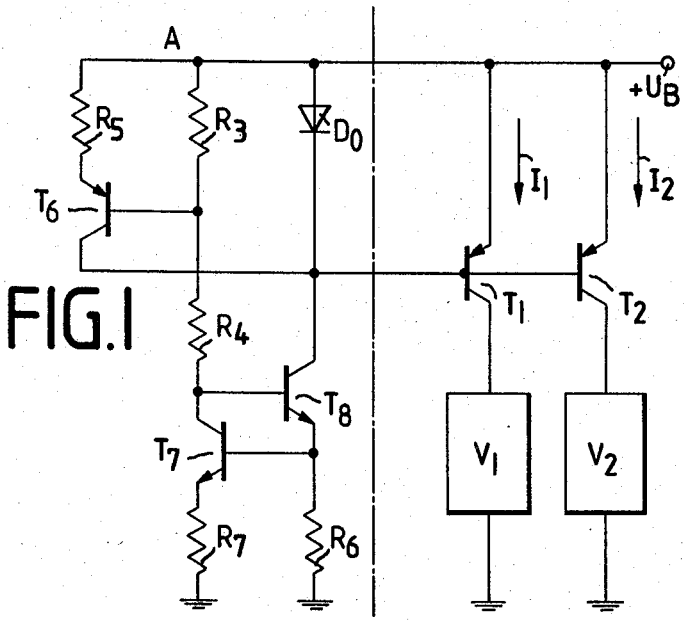
FIG. 1 shows the part of the circuit which is essential to the invention.

Referring now to the drawings, in FIG. 1, two current source transistors $T_1$ and $T_2$ are shown which supply loads $V_1$ or $V_2$, which lie in the collector circuit of the transistors, with current. These current sources are connected to a d.c. voltage source. The base-emitter initial voltage of the transistors $T_1$ and $T_2$ is obtained at a diode $D_O$. This diode draws its current via a further constant current source which comprises, for example, transistors $T_7$ and $T_8$. Thus the collector-base path of one transistor $T_7$ is connected in parallel with the base-emitter path of the other transistor $T_8$. Both transistors have an emitter resistor $R_6$ or $R_7$ respectively. A series resistor lying in the collector branch of the transistor $T_7$ is constructed as a voltage divider $R_3$, $R_4$. The base electrode of a transistor $T_6$ is connected to the tap of this voltage divider at the connection between the resistors $R_3$ and $R_4$, the transistor $T_6$ being connected together with its emitter resistor $R_5$ in parallel with the diode $D_O$. In the example shown, the transistors $T_1$, $T_2$ and $T_6$ are pnp-transistors while transistors $T_7$ and $T_8$ are npn-transistors.

With a constant d.c. supply voltage $U_B$, a temperature-stabilized constant current flows through transistors $T_1$ and $T_2$. The diode $D_O$, the temperature characteristics of which must agree with the temperature characteristics of the transistors $T_1$ and $T_2$, ensures temperature stabilization.

However if the d.c. supply voltage changes, then the current $I_1$ or $I_2$ respectively changes because of the characteristics of transistors and because of the internal resistance of the current source circuits, which internal resistance is not infinitely large. As $U_{CE}$ increases at the transistors $T_1$ and $T_2$, the current $I_C$ usually rises. The circuit member A serves to compensate or overcompensate for this effect. In this circuit, current through the voltage divider $R_3$, $R_4$ is almost proportional to the d.c. supply voltage $U_B$. As the d.c. supply voltage rises the voltage drop across resistor $R_3$ also rises. As a result, the transistor $T_6$ is controlled progressively into its conductive condition. Thus current is drawn from diode $D_O$ so that the voltage drop across this diode is less and the current source transistors $T_1$ and $T_2$ are therefore controlled to have smaller collector currents. The circuit member A may be so dimensioned that, as the d.c. supply voltage $U_B$ rises, the currents $I_1$ and $I_2$ through the transistors $T_1$ and $T_2$ remain constant. Overcompensation may also be achieved with appropriate choice of values, i.e. the current through transistors $I_1$ and $I_2$ may be made to become less as the d.c. supply voltage rises further.

Figure 2:
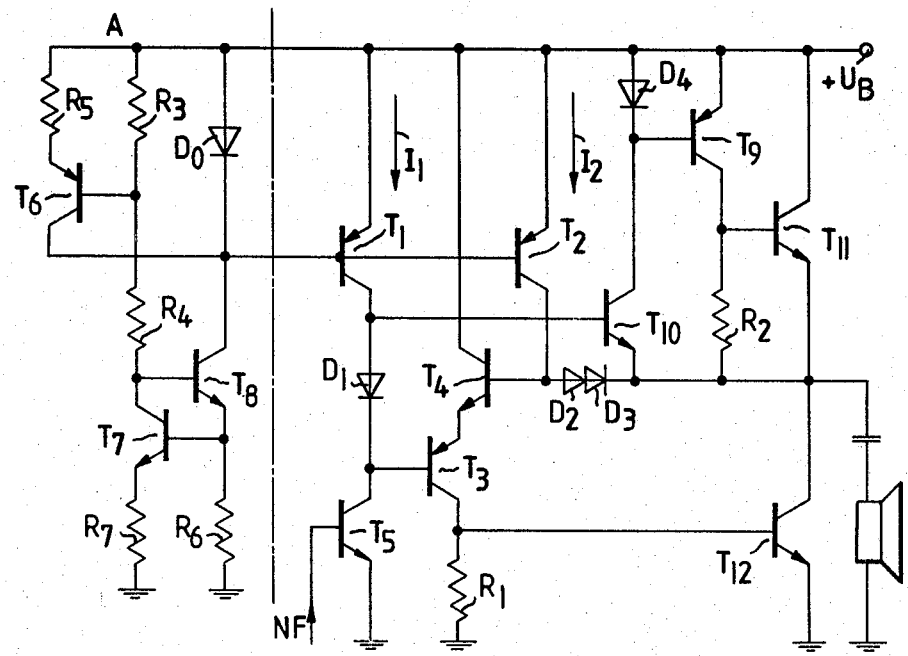
FIG. 2 shows in greater detail how the collector-quiescent current may be affected by the output stage transistors of a push-pull output stage circuit using the circuit in accordance with the invention.

From the circuit according to FIG. 2, another advantageous method of using the stablizing circuit in accordance with the invention is apparent.

The stablizing circuit A is connected to a push-pull-B- output stage. As small a collector quiescent current as possible should flow through the output stage transistors $T_{11}$ and $T_{12}$, the said collector quiescent current being independent of the temperature of the d.c. supply voltage $U_B$. Compensation for temperature is achieved, as was already mentioned, by obtaining the initial voltages at the diode paths operated in the forward direction, these diode paths having the same temperature characteristics as the transistors.

The circuit according to FIG. 2 in turn has transistors $T_1$ and $T_2$ which may be compared with those of the circuit according to FIG. 1. The diode $D_1$ and the transistor $T_5$, whose base is controlled by the low-frequency signal, lie in the collector path of the transistor $T_1$. The signal tapped off at the collector of the transistor $T_5$ is passed to the base of the transistor $T_3$, which has a resistor $R_1$ in its collector path, the base-emitter initial voltage for the end stage transistor $T_{12}$ drops across the resistor $R_1$. The emitter of a further transistor $T_4$ is connected after the emitter of the transistor $T_3$ and its collector is connected to the d.c. voltage source. In the base branch of the transistor $T_4$ there lie diodes $D_2$ and $D_3$ which are connected to the center tap of the two output stage transistors $T_{11}$ and $T_{12}$. Furthermore, the collector of the transistor $T_2$ is connected to the base electrode of the transistor $T_4$, the current $I_2$ flowing in this transistor $T_2$. The circuit which comprises a diode $D_4$, a transistor $T_9$ with its collector resistor $R_2$ and a transistor $T_{10}$, serves to control the transistor $T_{11}$. The diode $D_4$ thus determines the base-emitter voltage of the transistor $T_9$, the stablized base-emitter initial voltage of the output stage transistor $T_{11}$ dropping across the collector resistor $R_2$ of the transistor $T_9$. The transistor $T_{10}$, which is connected in series with the diode $D_4$, is controlled at the base by means of the diode $D_1$.

Transistors $T_3$ and $T_4$ are complementary transistors.

Transistors $T_1$, $T_2$, $T_6$, $T_9$ and $T_3$ are pnp-transistors, for example while transistors $T_4$, $T_5$, $T_7$, $T_8$, $T_{10}$, $T_{11}$ and $T_{12}$ are npn-transistors. The circuit may also be constructed with transistors of the opposite type of conductivity respectively. The diodes $D_1$, $D_2$ and $D_3$ are operated in the forward direction and serve to produce the initial voltage for the transistors $T_3$, $T_4$ and $T_{10}$. The diodes obtain their flow currents from the current sources $I_1$ and $I_2$.

The diodes $D_1$ to $D_3$ and the base-emitter paths of the transistors $T_3$, $T_4$ and $T_{10}$ form a closed circuit; the sum of all of the voltage drops within this circuit equals zero. The base-emitter initial voltages for the transistors $T_{11}$ and $T_{12}$, which are required for the actual push-pull-B-output stage transistors $T_{11}$ and $T_{12}$ in order to set a small collector quiescent current of only a few mA, are formed across the resistors $R_1$ and $R_2$. These voltages are temperature-stablized because the diodes used in the circuit have the same temperature characteristics as the transistors. In the manner already described, the collector quiescent current through the output stage transistors $T_{11}$ and $T_{12}$ become moreover independent of the magnitude of the d.c. supply voltage $U_B$ with the aid of the circuit member A.

It will be understood that the above description of the present invention is susceptible to various modification changes and adaptations.

What is claimed is:

1. A circuit for controlling a current source transistor as a function of a d.c. supply voltage for the transistor, comprising: a further current source connected to receive the d.c. supply voltage; a component connected to said further current source to be supplied with current by said further source, and connected to said current source transistor in a manner such that the voltage across said component constitutes the control voltage for said transistor; and a resistor which is controllable in dependence on the supply voltage connected in parallel with said component for stabilizing the current provided by said current source transistor upon variations in the supply voltage.

2. A circuit as defined in claim 1, wherein said component is a semiconductor diode which is connected in parallel with the base emitter path of said current source transistor and which has the same temperature characteristics as said current source transistor.

3. A circuit as defined in claim 2, wherein said further current source comprises a voltage divider and said controllable resistor comprises an additional transistor having a base connected to the tap of said voltage divider, said additional transistor having a collector-emitter path connected in parallel with said diode controlling said current source transistor.

4. A circuit as defined in claim 3, wherein said controllable resistor further comprises a second resistor connected in series with the collector-emitter path of said additional transistor.

5. A circuit as defined in claim 4, wherein said further current source further comprises: first and second transistors with said voltage divider being connected to the collector of said first transistor, the collector-base path of said first transistor being connected in parallel with the base-emitter path of said second transistor, and said diode being connected to the collector of said second transistor; and emitter resistance means connected between both said first and second transistors and a point at circuit reference potential.

6. A circuit as defined in claim 1, wherein said circuit has such values that said controllable resistor operates to cause the current through said current source transistor to either remain constant or decrease as the d.c. supply voltage increases.

7. A circuit for controlling a current source transistor in dependence on a d.c. supply voltage comprising: a further current source connected to receive the d.c. supply voltage; a component connected to be supplied with current from said further current source and across which a control voltage for said current source transistor is established; and a resistor controllable in dependence on said d.c. supply voltage and connected in parallel with said component for stabilizing the current provided by said current source transistor upon variations in the supply voltage.

8. A circuit for controlling a current source transistor, which transistor is connected to a source of a d.c. supply voltage and operates to produce a supply current determined by a control voltage, said circuit comprising: a further current source connected to the d.c. voltage source; a component connected to be supplied with current by said further current source and connected to said transistor for causing the voltage drop across said component to constitute the control voltage for said transistor; and a resistor presenting a variable resistance connected in parallel with said component, said resistor being further connected for causing its resistance to vary as a function of the d.c. supply voltage to thereby influence the control voltage in a manner to stabilize the current provided by said current source transistor upon variations in the d.c. supply voltage.

* * * * *